United States Patent [19]

Mermelstein

[11] Patent Number: 4,894,615
[45] Date of Patent: Jan. 16, 1990

[54] STRESS-RELIEVED AMORPHOUS METAL RIBBON MAGNETOMETER HAVING VISCOUS FLUID INTERFACE

[75] Inventor: Marc D. Mermelstein, Chevy Chase, Md.

[73] Assignee: Geo-Centers, Inc., Newton Centre, Mass.

[21] Appl. No.: 166,706

[22] Filed: Mar. 11, 1988

Related U.S. Application Data

[63] Continuation-in-part of Ser. No. 835,545, Mar. 3, 1986, Pat. No. 4,769,599.

[51] Int. Cl.$^4$ ............... G01R 33/02; G01R 33/00
[52] U.S. Cl. ............................ 324/244; 310/326
[58] Field of Search ............... 324/209, 244; 335/3, 335/215; 365/157; 360/113; 310/323, 328, 321, 326, 340, 345

[56] References Cited

U.S. PATENT DOCUMENTS 4,565,940 11/1986 Hubbard, Jr. ............... 310/326
4,769,599 9/1988 Mermelstein ............... 324/244

Primary Examiner—Gerard R. Strecker
Assistant Examiner—Walter E. Snow
Attorney, Agent, or Firm—Wolf, Greenfield & Sacks

[57] ABSTRACT

A highly-sensitive, physically small and rugged magnetometer employs a magnetostrictive amorphous metal ribbon core. A piezoelectric driver induces stress variations in the ribbon of a magnitude determined by an external magnetic field. The amplitude of the variations in magnetization is sensed by a pick-up winding disposed around the ribbon core. The dynamic range of the device is improved by employing a nulling field winding around the core to continuously null out the magnetization of the core. In contrast to the non-linear characteristic of the conventional fluxgate magnetometer, the invention provides a linear response to magnetic field strength which simplifies the processing circuitry. In addition, the ribbon may be field-annealed to improve the sensitivity of the device. Still further, low-frequency stresses in the ribbon (due to thermal expansion and the like) are relieved with a viscous fluid interface between the ribbon and support to thereby reduce low-frequency noise in the output signal and drifts in the calibration.

23 Claims, 8 Drawing Sheets

4,894,615

STRESS-RELIEVED AMORPHOUS METAL RIBBON MAGNETOMETER HAVING VISCOUS FLUID INTERFACE

This application is a continuation-in-part of application Ser. No. 06/835,545 filed Mar. 3, 1986, now U.S. Pat. No. 4,769,599.

FIELD OF THE INVENTION

This invention relates in general to apparatus for the detection of magnetic fields and the measurement of their intensities. More particularly, the invention pertains to the detection and measurement of DC and low frequency magnetic fields by a magnetometer employing a novel arrangement in which the amplitude of stress-induced magnetic flux variations in an amorphous metal magnetostrictive ribbon element is changed by the magnetic field being measured and the change is detected through the electric signal induced in a pick-up coil surrounding the magnetostrictive element.

BACKGROUND OF THE INVENTION

The conventional fluxgate magnetometer depends for its operation upon the rapid AC magnetization of a pair of high permeability cores. Each core carries a primary winding and a secondary winding, one being disposed inside the other. Upon the flow of AC current through the primary windings, the cores are magnetized. The fluctuating magnetization induces currents in the secondary windings. If a DC external field (i.e., the siqnal field) is present, the magnetization of the core is increased by the external field when the AC magnetic field is in the same direction as the DC field and is decreased when the AC magnetic field is in the opposite direction. By employing two cores and arranging their AC fields to be 180° out of phase, the signal obtained from the connected secondary windings is doubled for a DC external field of constant intensity.

Fluxgate magnetometers are commonly employed for the detection and measurement of weak magnetic fields. Because of their sensitivity fluxgate magnetometers are useful for detecting buried or sunken objects whose presence affects the local magnetic field. Because of their directional properties, fluxgate magnetometers have been employed as maqnetic compasses.

A major drawback of conventional fluxgate magnetometers is that their response to magnetic field strength is non-linear because of the inherent characteristics of the core material. Consequently, magnetic field strength signals obtained from the conventional fluxgate magnetometer require sophisticated processing to assure the accuracy of measurement.

The principal object of the invention is to provide an improved magnetometer for the detection and measurement of DC and low frequency magnetic fields.

Another object of the invention is to provide a magnetometer having the sensitivity to detect and measure magnetic fields of lower strength than those detectable and measureable by conventional fluxgate magnetometers.

A further object of the invention is to provide a magnetometer whose signal processing requirements are less complex compared to the requirements of conventional fluxgate magnetometers because the invention utilizes a core characteristic that is intrinsically linear whereas the core characteristic utilized in the conventional fluxgate magnetometer is intrinsically non-linear.

SUMMARY OF THE INVENTION

Applicant's invention is a magnetometer in which the amplitude of stress-induced magnetic flux variations in a magnetostrictive amorphous metal ribbon element are changed by an applied magnetic field (to be measured) and the changes are detected through an electrical signal induced in a pick-up coil surrounding the ribbon element.

In a first embodiment, a very thin ribbon element extends between a piezoelectric plate and a rigid support and is attached thereto at its opposing ends. In a second embodiment, wherein the device can be made entirely solid state, the ribbon is placed on top of a piezoelectric substrate and the ribbon may be a sputtered film of the amorphous metal.

An oscillating electrical signal is applied to the piezoelectric plate or substrate whereby the piezoelectric applies an oscillating dither stress to the ribbon element which induces magnetization fluctuations along the longitudinal length of the element of a magnitude proportional to the strength of an applied magnetic field. The equilibrium tension in the ribbon may be adjusted either by varying the position of the piezoelectric plate or support (when the ribbon is suspended therebetween) or by applying a bias voltage to the piezoelectric. Adjustment of the equilibrium tension in the ribbon improves the sensitivity of the device.

Another aspect of the invention is to provide a viscous fluid interface between the ribbon and its supporting structure which relieves low-frequency stresses on the ribbon caused by thermal expansion or the like. Use of the viscous fluid interface prevent shifts in the calibration and reduces low-frequency noise in the output signal.

In another preferred embodiment of the invention, the amorphous metal ribbon is field-annealed in order to improve the sensitivity of the device.

In yet another preferred embodiment of the invention, a nulling feedback circuit is provided wherein an opposing field of equal and opposite strength to the measuring field is applied to the ribbon so that the field at the ribbon is always maintained at substantially zero. The electrical signal required to provide the opposing field is taken as the strength of the measuring field. Use of the nulling circuit enhances the dynamic range of the sensor.

DETAILED DESCRIPTION OF THE PREFERRED EMBODIMENTS

By way of comparison, the operation of the conventional fluxgate magnetometer is described below with regard to FIGS. 1–3.

the conventional fluxgate magnetometer

Figure 1:
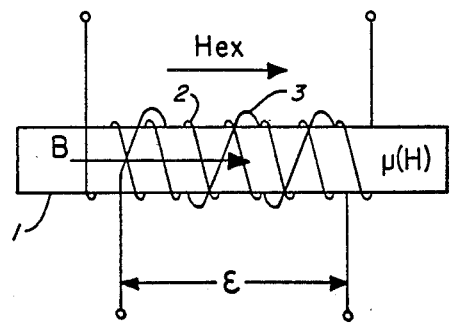
FIG. 1 schematically depicts a rudimentary arrangement for a conventional fluxgate magnetometer.
Figure 2:
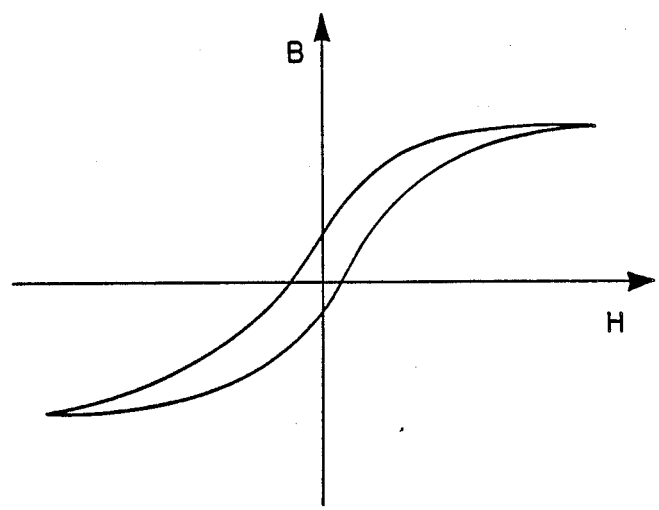
FIG. 2 shows the B vs H hysteresis loop for magnetic material of the kind typically employed in the conventional fluxgate magnetometer.

FIG. 1 shows the rudimentary arrangement of a magnetometer of the conventional fluxgate type. The simple fluxgate magnetometer shown in FIG. 1, depends for its operation on the AC magnetization of a core 1 of high magnetic permeability by a signal coil 2 surrounding the core. Disposed around the signal coil 2 is a pick-up coil 3. Changes in the magnetic flux $\Phi$ in the core induce an electromotive force (emf) $\epsilon$ in the pick-up coil 3. That induced signal in the pick-up coil is subsequently processed to obtain a voltage that is a measure of magnetic field intensity. The emf $\epsilon$ is given by Faraday's law of electric induction:

$$\epsilon = N \frac{d\Phi}{dt} \quad (1)$$

where N is the number of turns of the pick-up coil. The magnetic flux $\Phi$ is equal to the product of the magnetic induction B and the cross-sectional area A of the core. Hence, the emf may be rewritten as $$\epsilon = NA \frac{dB}{dt} \quad (2)$$

The magnetic field intensity B inside the core is given by $$B = \mu_o(H+M) \quad (3)$$

where H is the magnetic field strength, M is the magnetization, and $\mu_o$ is the permability of free space. The magnetization M of the conventional fluxgate magnetometer core is given by $$M = \chi H \quad (4)$$

where the constant of proportionality between the field strength H and the magnetization M is the susceptibility $\chi$. Substituting equation (4) into equation (3) yields the relation between the magnetic induction B and field strength H which is $$B = \mu H \quad (5)$$

where the magnetic permeability $\mu$ is defined as $$\mu = \mu_o(1+\chi) \quad (6)$$

In general, $\mu$ is a non-linear function of the field strength, i.e., $\mu = \mu(H)$. This is readily seen when plotting the B versus H hysteresis loop of a typical magnetic core material, as shown in the plot of FIG. 2. In that plot, the permeability $\mu$ is the slope of the loop and is a function of the field strength H. Substituting equation (5) into equation (2) yields $$\epsilon = NAH \frac{d\mu}{d\tau} + NA\mu \frac{dH}{d\tau} \quad (7)$$

where allowance has been made for time variations in $\mu$ and H. Time variations are introduced to the permeability $\mu(H)$ by imposing a time dependent field $H_1(t)$ in addition to the magnetic strength $H_o$ of the signal field which is either a DC field or a low frequency AC field. The total field strength H is $$H = H_o + H_1(t) \quad (8)$$

Substituting equation (8) into equation (7) yields $$\epsilon = NA(H_o + H_1) \frac{d\mu}{dt} + NA\mu \frac{dH_1}{dt} \quad (9)$$

Figure 3:
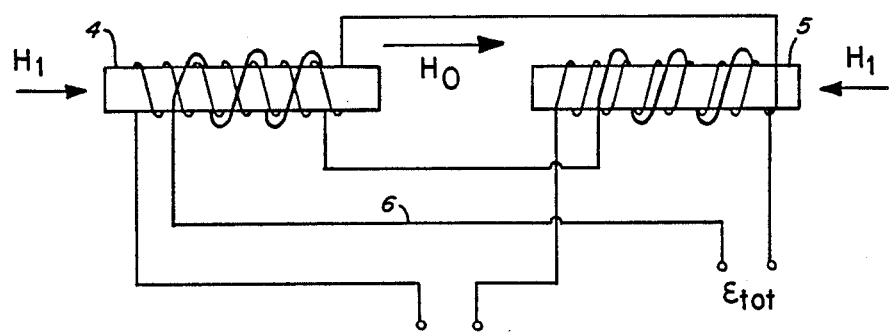
FIG. 3 schematically depicts the arrangement of a conventional fluxgate magnetometer.

If, as shown in FIG. 3, a second core 5 with a magnetizing field $H_1$ that is 180° out of phase with the magnetic field $H_1$ of first core 4 is placed within the pick-up coil 6, the emf due to that second core is given by $$\epsilon = NA(H_o - H_1) \frac{d\mu}{dt} - NA\mu \frac{dH_1}{dt} \quad (10)$$

The total emf is the sum of equations (9) and (10) and is given by $$\epsilon_{tot} = NAH_o \frac{d\mu[H(t)]}{dt} \quad (11)$$

Hence the total emf is due to the flux change resulting from the presence of the low frequency signal field $H_o$ and the change in magnetic permeability $\mu(H)$.

The time dependence of the permeability of the conventional fluxgate magnetometer is expressed explicitly in the following equation $$\epsilon_{tot} = NAH_o \frac{d\mu}{dH_1} H_1 \frac{dH_1}{dt} \quad (12)$$

That basic fluxgate equation shows that the emf induced in the pick-up coil 6 as a result of the time varying permeability is proportional to the low frequency signal field $H_o$. It is immediately clear that processing of the signal emf is greatly complicated by the non-linear behavior of the $d\mu/dH_1$ term.

amorphous metal ribbon magnetometer

In contrast to the conventional fluxgate magnetometer, the invention utilizes a core having an altogether different physical characteristic—i.e., the characteristic of magnetostriction. In the embodiment of the invention shown in FIG. 4, the core 10 is constituted of a magnetostrictive element. The core element preferably is a magnetostrictive material such as Metglas 2605S2 which is an amorphous metal substance available from Metglas Products of Parsippany, N.J., in the form of a ribbon (Metglas is a registered trademark of Allied Chemical Corporation, Morristown, N.J.). Metglas is an amorphous iron-based ferromagnetic material having the formula $Fe_{81}B_{13.5}Si_{3.5}C_2$. When properly field-annealed it has been shown to have the largest values of the magnetomechanical coupling factor, $k_{33}$, ever measured.

The magnetization M in the magnetostrictive amorphous metal core is given by $$M = \chi_o^\sigma H_o + \mu_o^{-1} d^H \sigma \quad (13)$$

where $\chi_o^\sigma$ is the magnetic susceptability at constant stress, and $d^H$ is the piezomagnetic modulus at constant field strength. The two coefficients in the above constitutive relation may be estimated from the dipole rotation model for the magnetostrictive amorphous metal ribbon core. They are found to be $$\chi_o^\sigma = \frac{M_D}{H_A}$$

and $$d^H = \frac{3\lambda_s H_o}{H_A^2}$$

where $M_D$ is the length of the domain magnetization vector, $H_A$ is the anisotropy field, $\lambda_s$ is the magnetostrictive constant, and $H_o$ is the low frequency signal field. Application of a time dependent stress $\sigma(t)$ to the magnetostrictive ribbon core 10 by a piezoelectric driver 11 allows the development of a time dependent magnetization whose amplitude is proportional to the signal magnetic field $H_o$. The magnetic induction B is found from equations (3) and (13) to be $$B = \mu H + d^H \sigma(t) \quad (14)$$

where $$\mu = \mu_o(1 + M_D/H_A) \quad (15)$$

Having determined the magnetic induction B, the emf may be computed from equation (2). It is found to be $$\epsilon = NA \frac{3\lambda_s}{H_A^2} H_o \frac{d\sigma(t)}{dt} \quad (16)$$

Hence, the emf induced in the pick-up 12 is proportional to the signal field $H_o$.

A comparison of equation (16) with equation (12) facilitates a comparison of the magnetostrictive technique vis a vis the conventional fluxgate technique. Firstly, the time-dependent saturating field strength $(dH_1/dt)$ in equation (12) is replaced by the time-dependent stress field $(d\sigma/dt)$ in equation (16). More importantly, the non-linear field dependent term $H_o d\mu/dH_1$ in equation (12) is replaced by the simple linear term $3\lambda_s H_o/H_A^2$ in equation (16). The importance of this distinction is discussed herein in a subsequent passage.

Figure 4:
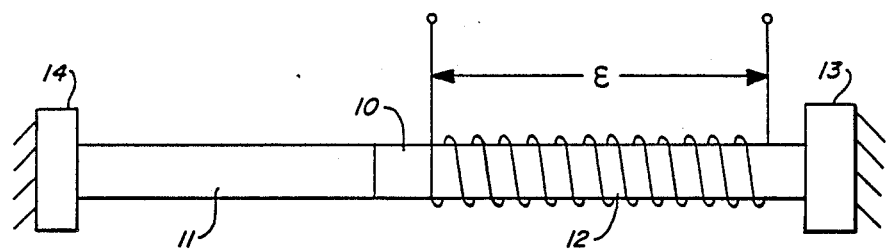
FIG. 4 schematically depicts a rudimentary embodiment of the invention employing a magnetostrictive amorphous metal ribbon core.

In the rudimentary embodiment of the invention shown in FIG. 4, the core 10 is a magnetostrictive amorphous metal ribbon which is secured at one end to a rigid support 13. At its other end the ribbon 10 is attached to a piezoelectric driver 11 extending from a second support 14. A sinusoidally varying stress is applied to the taut ribbon by the piezoelectric driver upon which a varying voltage is impressed. The piezoelectric driver generates an internal stress field $\sigma(t)$ in the magnetostrictive ribbon. Preferably, the ribbon is driven at its resonant frequency $\omega_o$ corresponding to a sonic wave traveling longitudinal along the ribbon.

Examination of the domain constitutive equation (14) shows that a longitudinal magnetization will develop in the core as a result of the stress $\sigma$ only in the presence of a non-zero low frequency magnetic field $H_o$ (i.e. the signal field) inasmuch as the piezomagnetic modulus is proportional to $H_o$. Assuming a sinusoidal dependence to the stress field $$\sigma(t) = \sigma_o \sin\omega_o t \quad (17)$$

where $\sigma_o$ is the stress amplitude, the induced emf is found from equations (2) and (14) to be $$\epsilon(\omega) = \frac{\omega_o NA 3\lambda_s H_o \sigma_o}{H_A^2} \cos\omega t \quad (18)$$

The amplitide $\epsilon_o$ of the emf is $$\epsilon_o = \frac{\omega_o NA 3\lambda_s H_o \sigma_o}{H_A^2} \quad (19)$$

and can be readily detected using a lock-in amplifier (i.e. using phase sensitive detection techniques).

The sensitivity $\eta$ of the magnetostrictive fluxgate magnetometer is defined as the change in induced emf per change in the strength of the signal magnetic field $$\eta = \frac{\Delta\epsilon}{\Delta H_o} \quad (20a)$$

-continued $$\eta = \frac{NA3\lambda_s \sigma_o \omega_o}{H_A^2} \quad (20b)$$

Assuming that the applied stress field has an amplitude $\sigma_o$ equal to 10% of the critical stress, $$\sigma_c = 0.7 \times 10^6 \frac{J}{m^3}$$

that the pick up coil has 1000 turns, that the ribbon has a width of 1 cm. and a thickness of 30 μm, that the magnetostriction constant $\lambda_s$ is 30 ppm, that the anisotropy field is 80 A/m and that the operating frequency is 10 kHz, the sensitivity is found to be $$\eta = 15 \ \mu V/nT$$

Hence, a signal magnetic field of 1.0 nT will induce an emf of 15 μV which is readily detectable using conventional synchronous detection techniques.

Figure 5:
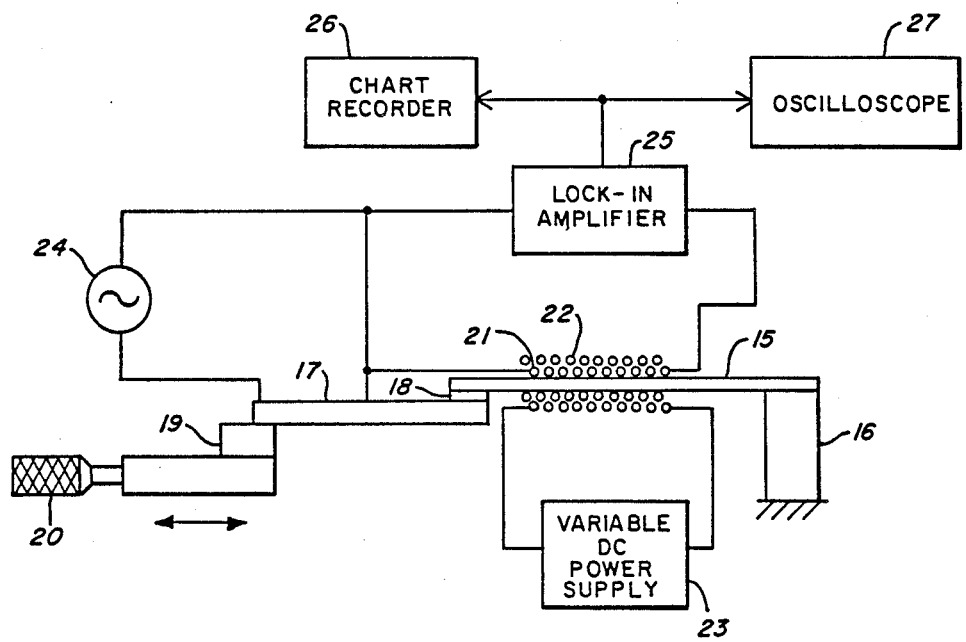
FIG. 5 schematically depicts a crude but operative embodiment of the invention that was actually built and tested.

FIG. 5 shows the scheme of a crude but operable embodiment of the invention that was actually constructed and tested. In that embodiment, the core 15 is a 2"×½" magnetostrictive amorphous metal ribbon (Metglas 2605S2) which was cut from a 2" wide ribbon roll. One end of the 2" long ribbon is secured to a stationary rigid support 16. The other end of the ribbon is cemented to a 30 mm×13 mm×0.7 mm piezoelectric ceramic plate 17 having thereon spaced electrodes. The piezoelectric plate is made of PZT5A material. The magnetostrictive ribbon is secured by an epoxy adhesive to one 13 mm edge of the piezoelectric plate with a glass slip 18 interposed between the ribbon and the plate to electrically insulate the ribbon from the electroded surface of the piezoelectric plate. The opposite 13 mm edge of the piezoelectric plate is attached to an insulator block 19 mounted on a micropositioner 20. Adjustment of the micropositioner enables the amount of tension applied to the ribbon to be changed. Because the magnetoelastic response of the ribbon is dependent upon the equilibrium tension, the performance of the ribbon can be optimized by adjusting the micropositioner to provide the requisite tautness of the ribbon. As an alternative to the micropositioner, a dc bias voltage is applied to the plate for adjusting the equilibrium tension in the ribbon and thereby increasing the signal to noise ratio of the magnetometer.

The ribbon is surrounded by two coils 21 and 22, one within the other. The coil 21 is a pick-up coil having 100 turns of copper wire. The coil 22 is a magnetic field producing device having about 20 turns of 0.35 mm diameter copper wire A variable DC power source 23 supplies current to the coil 22 and produces a DC magnetic field which in MKS units is given by $$H = NI \quad (21)$$

where $N=2.9\times 10^3 \ m^{-1}$, and I is the current in amperes.

An oscillator 24 is connected to the piezoelectric plate and drives it at 100 kHz with an AC voltage of about 0.5 volt rms. The piezoelectric response of the plate stresses the magnetostrictive ribbon which, in the presence of the DC field established by coil 22, generates an emf in pick-up coil 21. That emf is detected by the lock-in amplifier 25 which is referenced to the piezoelectric ceramic plate 17 and monitored by a chart recorder 26 and an oscilloscope 27.

Figure 6:
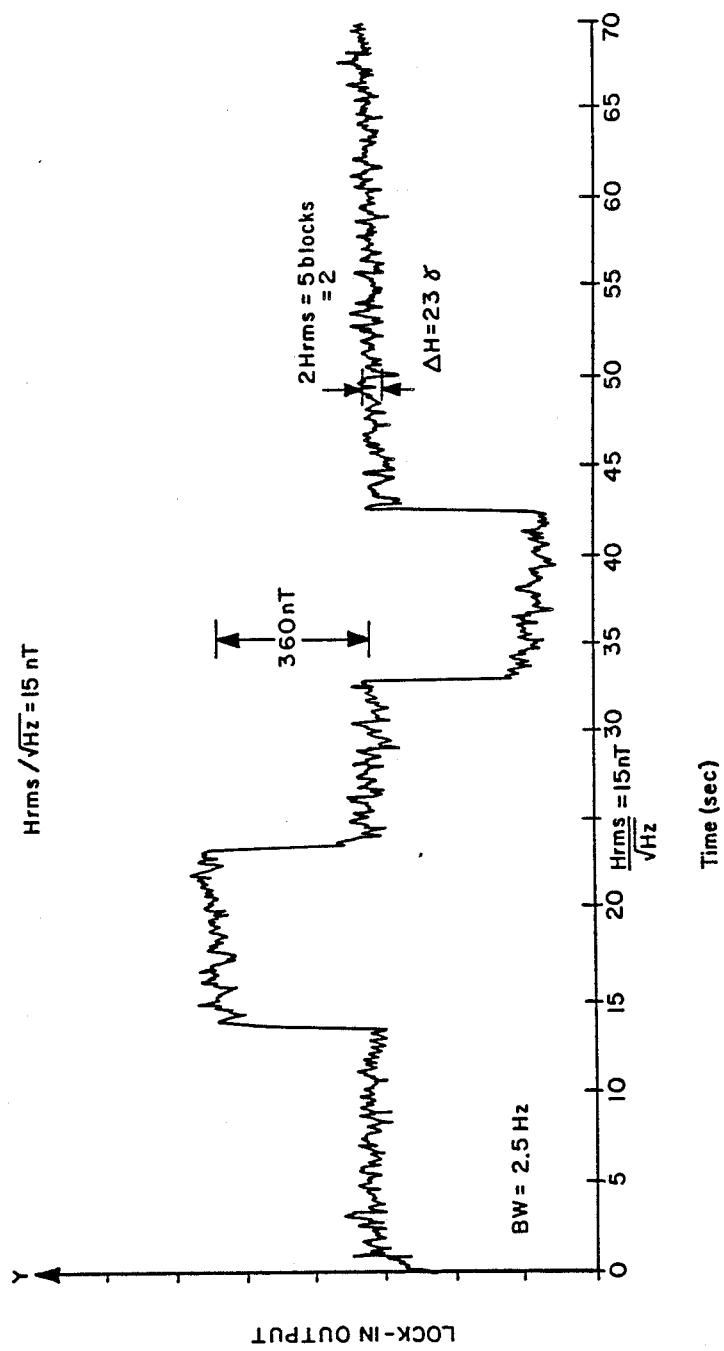
FIG. 6 is a chart of test data obtained with the FIG. 5 arrangement.

FIG. 6 is a chart of the magnetic field sensing data measured with the FIG. 5 arrangement. The data was taken in the following manner: the stress dither was applied to the ribbon by the piezoelectric driver and the oscillating emf was monitored by the oscilloscope. The DC bias field produced by coil 22 was adjusted to minimize the observed signal. This small stress-induced signal was simultaneously monitored by the lock-in amplifier 25 and the chart recorder 26. The current in the coil 22 was then changed by ±0.1 mA increments which corresponds to 360 nT steps in the DC magnetic field. The lock-in output reflects this change in the DC field. The minimum detectable magnetic field is taken to be equal to the approximate rms noise level of the lock-in output, i.e., unity signal to noise ratio. It is found to be approximately 15 nT/√Hz in the bandwidth from DC to 1 Hz.

Figure 7:
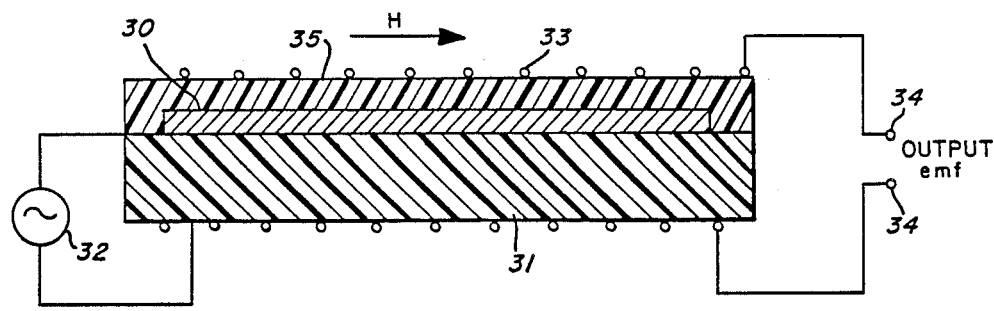
FIG. 7 schematically depicts a more advanced embodiment of the invention that is exceptionally rugged because the device is virtually all solid state.

A more advanced embodiment of the invention is schematically depicted in FIG. 7. In that FIG. 7 embodiment, a film 30 of the magnetostrictive amorphous metal is deposited by sputtering or some other suitable deposition process upon the surface of a substrate 31 of a piezoelectric material such as quartz. A voltage from a source 32 is applied to the piezoelectric substrate 31 in a manner imposing a sinusoidally varying stress upon the magnetostrictive film 30. That varying stress, in turn, causes a corresponding variation in the magnetization of the film 30 in the presence of a DC magnetic field which is schematically represented in FIG. 7 by the H arrow.

Surrounding substrate 31 is a pick-up winding 33 which senses the variations in the magnetization of the film 30 by induction and provides an emf signal at output terminals 34. The magnetostrictive film 30 is covered by a thin coat 35 of an electrically insulative material deposited over the magnetostrictive film to insulate the pick-up winding 33 from the film 30. Where necessary a thin insulator 36 may be interposed between the film 30 and the piezoelectric substrate 31, as indicated in the FIG. 8 embodiment. Major advantages of the FIGS. 7 and 8 embodiments are (1) the magnetometer can be exceptionally rugged because the device is virtually all solid state and (2) the magnetometer can be highly miniaturized because the component of greatest bulk is the piezoelectric substrate.

Figure 8:
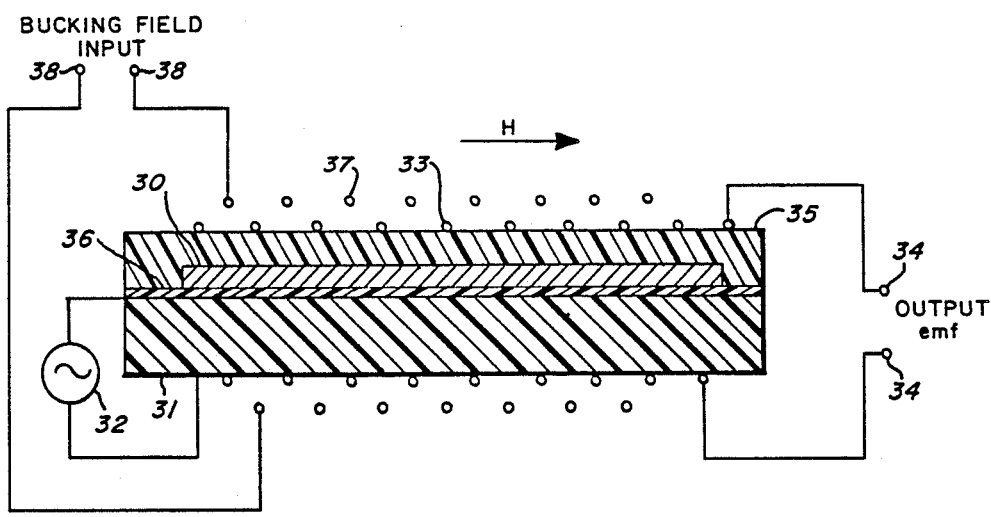
FIG. 8 is a variation upon the FIG. 7 embodiment which enables a magnetic field nulling technique to be used to increase the dynamic range.

The dynamic range of the invention embodiments can be improved by using a "nulling" technique. When using that technique, the magnetic field H is nulled out by an opposing magnetic field established, as shown in FIG. 8, by a "bucking (or nulling) field" winding 37 disposed around the substrate 31. When the magnetization of film 30 is no longer detectable by the pick-up winding 33, the current applied at terminals 38 of the "bucking field" winding 37 is then a measure of the intensity of the H magnetic field.

Another aspect of this invention is to provide a viscous fluid interface for reducing low-frequency stresses in the magnetostrictive element which may alter its piezomagnetic coupling constant (i.e., change the calibration) and introduce low frequency noise in the output signal. These low-frequency stresses are typically caused by thermal expansion or contraction of the piezoelectric driver, magnetostrictive element, or support structure, or by mechanical vibrations or bending forces applied thereto.

In another aspect of this invention, the magnetostrictive ribbon element is field-annealed to improve the sensitivity of the device.

The viscous fluid interface and fluid annealing aspects of the invention are illustrated in three additional embodiments shown in FIGS. 9–16 and described below.

Figure 9:
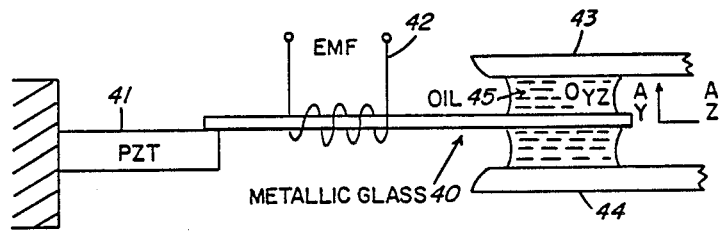
FIG. 9 is a schematic diagram of one embodiment of the stress-relieved magnetometer of this invention which was actually built and tested wherein one end of an amorphous metal ribbon is disposed between a pair of parallel supports and a viscous fluid is provided between each of the supports and the ribbon.

FIG. 9 shows a first embodiment of a stess-relieved amorphous metal ribbon magnetometer of this invention. In addition to providing a viscous fluid 45 for stress-relief, the magnetostrictive ribbon 40 has been annealed at 400° C. for one hour in a transverse field of 1200 Oe and subsequently cooled to room temperature in the presence of the field, in order to improve the sensitivity of the magnetometer.

One end of annealed ribbon 40 (a 5 cm×1 cm×25 μm ribbon of Metglas 2605S2) is epoxied to a piezoelectric driver 41 which imposes an oscillating stress on the ribbon. The opposite end of the ribbon is placed between two rigidly supported microscope glass slides 43, 44 that are spaced 0.4 mm apart. The region between the glass slides is filled with a heavy-grade machine oil characterized by a viscosity $\eta=0.5$ Ns/m² and a density $\rho_L=0.9\times 10^3$ kg/m³. A 1 cm segment of the ribbon is immersed in the oil.

A visual inspection of the ribbon end with a microscope demonstrates that the fluid maintains the ribbon at a central position between the glass slides. Therefore, the only forces (neglecting the gravitational body forces) acting on the ribbon and are those due to the presence of the fluid. These forces include the fluid surface tension and the frictional force due to the fluid viscosity. An upper bound for the longitudinal stress in the ribbon that results from the oil/air/metal interface may be estimated from $\alpha/t$, where $\alpha=3\times 10^2$ N/m is the surface tension coefficient for the oil/air interface, and t=25 μm is the ribbon thickness. The ratio of $\alpha/t$ is evaluated to be $1.2\times 10^3$ N/m², which is much less than the critical stress $\sigma_c=0.7\times 10^6$ N/m² of the amorphous metal. The amplitude of the (frictional) shear stress exerted by the viscous fluid on the moving ribbon surface is given by:

$$\sigma_{yz}^0 = \sqrt{(2)}\eta U_0/\delta \tag{22}$$

where $U_0$ is the ribbon surface velocity amplitude and $\delta=(2\eta/\rho_L\omega)^{\frac{1}{2}}$ is the penetration depth for a ribbon surface oscillating at a frequency $\omega$ (Landau, L. L. and Lifshitz, E. M., "Fluid Mechanics", Pergamon Press, London, 1959, Chapter VII). It can be shown that the frictional force becomes negligible at low frequencies (a few hertz), where $U_0$ becomes very small and $\delta$ becomes large. Hence, termination of the ribbon in the viscous fluid maintains near-zero stess boundary conditions at low frequencies. Slow movement (e.g., due to thermal expansion) of the piezoelectric driver, metallic glass ribbon and/or support structure are therefore relieved without the imposition of stress on the ribbon element.

Figure 10:
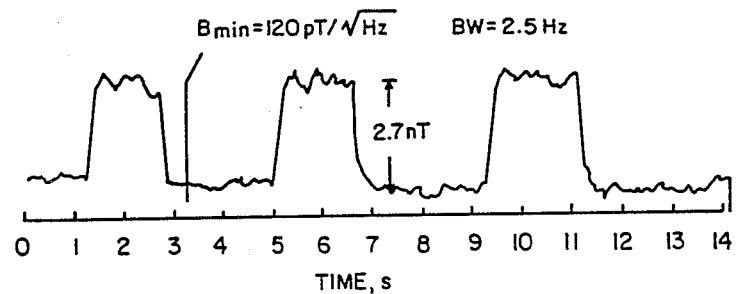
FIG. 10 is a chart recorder trace showing the response of the magnetometer of FIG. 9 to a 2.7 nT step in a DC magnetic field which demonstrates a minimum detectable field of 120 pT/$\sqrt{Hz}$ corresponding to a unity signal/noise ratio.
Figure 11:
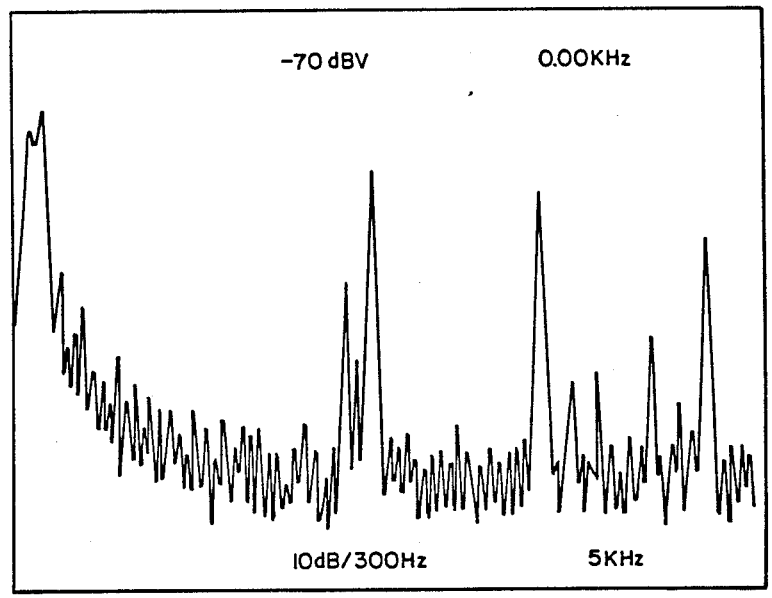
FIG. 11 is a graph of the power spectrum for the output of the magnetometer of FIG. 9 wherein the signal peak appearing at 35 kHz corresponds to the minimum magnetometer output and the adjacent noise floor is −135 dBV in 300 Hz bandwidth and corresponds to 20 pT/$\sqrt{Hz}$.

Minimum detectable field measurements for the magnetometer of FIG. 9 are exhibited in FIG. 10. The piezoelectric driver was tuned to a 35 kHz resonance, which presumably corresponds to a quarterwavelength fluxuation over the ribbon length. The stress-induced magnetization fluctuations in the ribbon induce an emf across the pick-up coil 42. The amplitude of the oscillating emf is measured with a lock-in amplifier. The DC magnetic field was adjusted to minimize the lock-in output and subsequently stepped by 2.7 nT. The signal/-noise ratio appearing in FIG. 10 demonstrates a short term minimum detectable field of 120 pT/$\sqrt{HZ}$. This represents an improvement by a factor of approximately 20 as compared to an identical measurement on the same field-annealed ribbon which was rigidly clamped to the support structure, and a factor of approximately 140 improvement over the use of an unannealed ribbon rigidly clamped to the support structure. The magnetometer sensitivity, defined as a change in emf per change in DC field, was measured to be 1.0 μV/nT, which was comparable to that measured for the rigidly mounted annealed ribbon. Hence, terminating the ribbon in a viscous fluid has removed a significant noise mechanism while maintaining sensitivity. The power spectrum measurement appearing in FIG. 12 demonstrates a field-equivalent noise floor of 20 pT/$\sqrt{HZ}$ in the frequency band adjacent the signal at 35 kHz. This suggests that a further reduction by a factor of approximately 6 should be possible (compare minimum detectable field of 120 pT/$\sqrt{Hz}$).

In summary, a viscous fluid interface between the sensing metallic glass ribbon and its support structure greatly reduced the development of low-frequency stresses in the ribbon and thereby reduced the environmentally induced noise. At the same time, the viscous fluid provides the appropriate high-frequency boundary conditions that permit the development of the strain resonance required for optimal performance of the magnetometer. It was also shown that annealing of the ribbon produced an increase in the signal-to-noise ratio.

Figure 12:
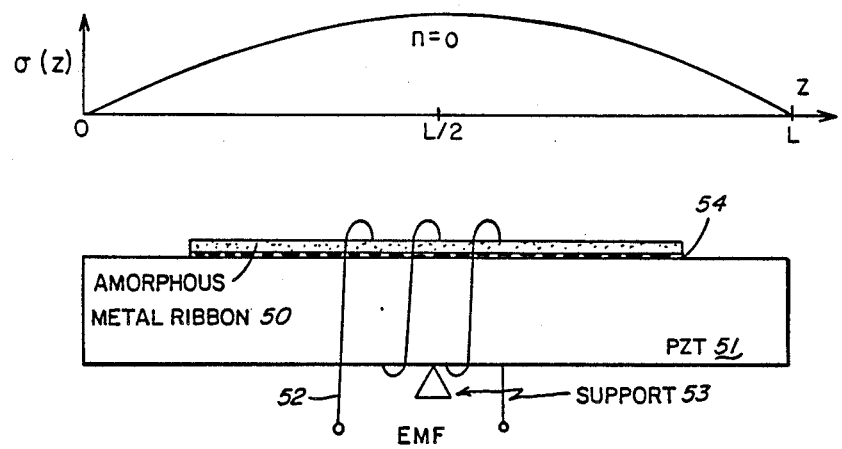
FIG. 12 is a schematic diagram of another embodiment of the stress-relieved magnetometer of this invention which was actually built and tested wherein a magnetostrictive amorphous metal ribbon is positioned on top of a piezoelectric substrate with a viscous fluid therebetween and showing the fundamental stress mode along the length of the substrate.

Another embodiment of the stress-relieved magnetometer of this invention is shown in FIG. 12. An electroded piezoelectric ceramic plate 51 (PZT5A) of dimensions 2½ inch×⅜ inch×0.6 mm is epoxied at its centerline to a 2-mm-diameter quartz support tube 53. Two wires are soldered at the end of the ceramic plate to provide electrical connections (not shown). The piezoelectric plate maintains free-free boundary conditions at the ends of its length dimension and clamped conditions at its center support. The acoustic modes of the piezoelectric plate are driven by a voltage oscillator. These normal modes of vibration may be characterized by the longitudinal stress:

$$\sigma_n(z,t) = \sigma_0 \sin(k_n z)\cos(\omega_n t) \tag{23}$$

where $\sigma_0$ is the stress amplitude, $k_n=(2n+1)\pi/L$ are the permitted acoustic wave vectors consistent with the boundary conditions, n=0,1,2 . . . are integers which label the normal modes, and L is the plate length. The resonant frequency is given by the dispersion relation $\omega_n = vk_n$, where $v=\sqrt{E/\rho}$ is the velocity of sound, E is Young's modulus, and $\rho$ is the density of the ceramic.

A field-annealed amorphous metal ribbon (Metglas 2605S2) of dimensions 2 inch×½ inch×25 μm is adhered to the piezoelectric plate with a viscous fluid of the previously described heavy-grade machine oil. The fluid transfers a dynamic stress from the piezoelectric element to the amorphous metal ribbon while maintaining the ribbon in a low-frequency stress relieved state. This arrangement minimizes the stress-induced noise. It is assumed that the local stress in the ribbon is congruent with the stress in the thicker ceramic plate and that the stress transfer efficiency is nearly unity. In this case, the resultant magnetization oscillations are given by:

$$M_n(z,t) = \mu_o^{-1} d(\bar{H})\sigma_n(z,t) \tag{24}$$

where $\mu_o$ is the permeability of free space, d is the longitudinal piezomagnetic modulus, and $\overline{H}$ is the local equilibrium (i.e., low frequency) signal magnetic field strength which is directed along the ribbon longitudinal (z) axis. The bar notation indicates a time average over a period that is long compared to $\omega_n{}^{-1}$ but is short compared to the characteristic time of the signal field fluctuations.

The low-field piezomagnetic modulus at zero equilibrium stress may be obtained from the dipole rotation model and is found to be $$d = 3\lambda_s \overline{H}/H_A{}^2$$

where $\lambda_s$ is the saturation magnetostriction and $H_A$ is the anistropy field. The local and external field strengths are related by $$\overline{H} = \overline{H}_{ex}/(1 + N_{zz}\chi_o{}^\sigma)$$

where $N_{zz}$ is the geometric demagnetizing factor and $\chi_o{}^\sigma$ is the free-longitudinal susceptibility.

The signal emf generated in a pick-up coil 52 located at $z=L/2$ may be obtained from Faraday's law of induction. For the n=0 stress mode, it is found to be $$\epsilon_s(t) = \frac{3\lambda_s \sigma_o NA\omega_0/\mu_o H_A{}^4}{1 + N_{zz}\chi_0{}^\sigma} \overline{B}_{ex}(t)\sin(\omega_0 t) \quad (25)$$

where N is the number of turns in the pick-up coil, A is the ribbon cross-sectional area, $\overline{B}_{ex} = \mu_o \overline{H}_{ex}$ is the external magnetic induction, and $\omega_0 = v\pi/L$ is the fundamental resonance frequency. All material constants and parameters are given in Table I. The output of the sensing element, given by Eq. (25), is amplified with a gain factor G and fed to the mixer of a lock-in amplifier that is referenced to the piezoelectric drive voltage. The root mean square (rms) mixer output is given by $$\epsilon'_s(t) = G\eta \overline{B}_{ex}(t), \quad (26)$$

where the intrinsic sensitivity (defined as the change in rms emf per change in magnetic induction) is given by $$\eta = (3\lambda_s \sigma_o NA\omega_o/\mu_o H_A{}^2)/\sqrt{(2)}(1+N_{zz}\chi_o{}^\sigma). \quad (27)$$

The mixer output is filtered by the lock-in amplifier low-pass filter whose transfer function is given by $(1+i\omega\tau)^{-1}$, where $\tau$ is the lock-in time constant. Hence, the signal voltage output in the frequency domain is $$\epsilon'_s(\omega) = G\eta \overline{B}_{ex}(\omega)/(1+i\omega\tau). \quad (28)$$

TABLE I

| Parameter values | |
|---|---|
| $\lambda_s = 27 \times 10^{-6}$ | $A = 2.5 \times 10^{-7}$ m$^2$ |
| $\chi_o{}^\sigma = 10^4$ | $E = 6.1 \times 10^{10}$ N/m$^2$ |
| $N_{zz} = 8.5 \times 10^{-4}$ | $\rho = 7.75 \times 10^3$ kg/m$^3$ |
| $H_A = 72$ A/m | $G = 10^5$ |
| $N = 200$ | $\tau = 100$ ms |

Figure 13:
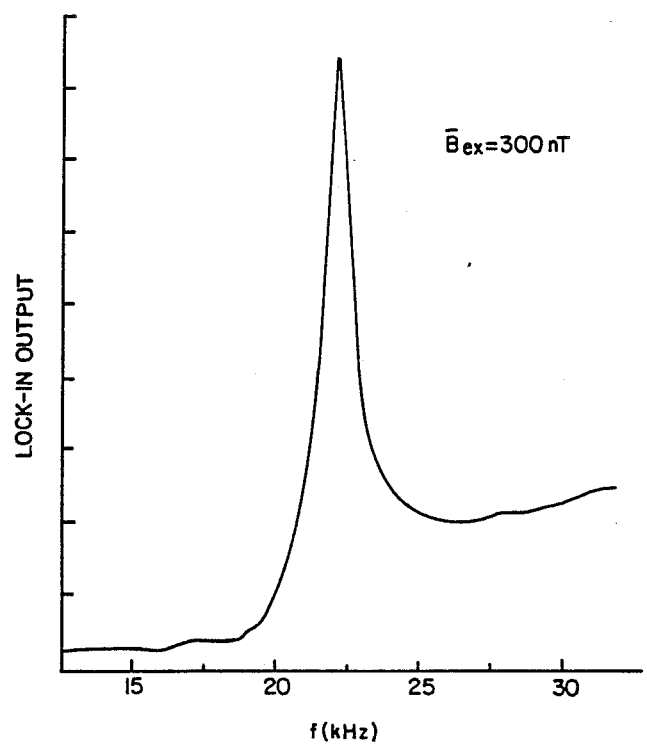
FIG. 13 is a graph of the frequency response of the magnetometer of FIG. 12 at a DC bias field of 300 nT wherein the peak centered at 22.4 kHz corresponds to the n=0 resonance mode and the calculated resonance frequency is 22.0kHz.
Figure 14:
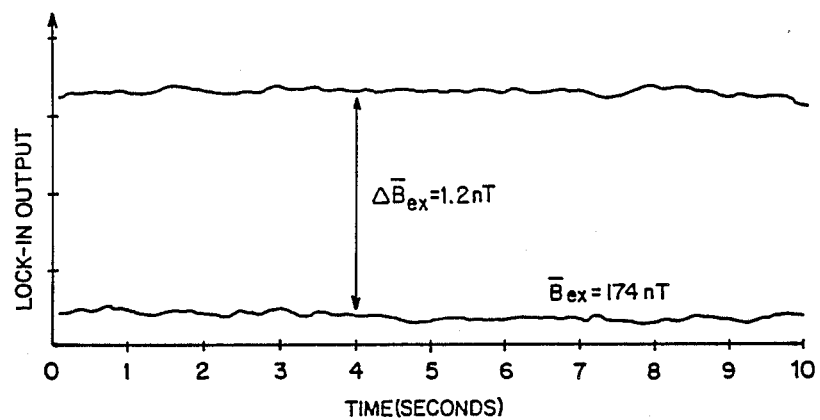
FIG. 14 shows chart recorder traces of the output of the magnetometer of FIG. 12 responding to a 1.2 nT step in the DC magnetic field wherein the observed magnetmeter sensitivity is n=1.25 nV/pT.

The intrinsic DC sensitivity $\eta$ was determined by tuning the piezoelectric drive frequency to the fundamental resonance at $\omega_o$. This resonance is shown in FIG. 13. The magnetometer output was substantially monitored as a function of time and is represented by the lower trace of FIG. 14. Introduction of a 1.2 nT step in the induction field increased the magnetometer output yielding the upper trace in FIG. 14. This step in the output corresponds to an intrinsic sensitivity of 1.25 nV/pT.

Figure 15:
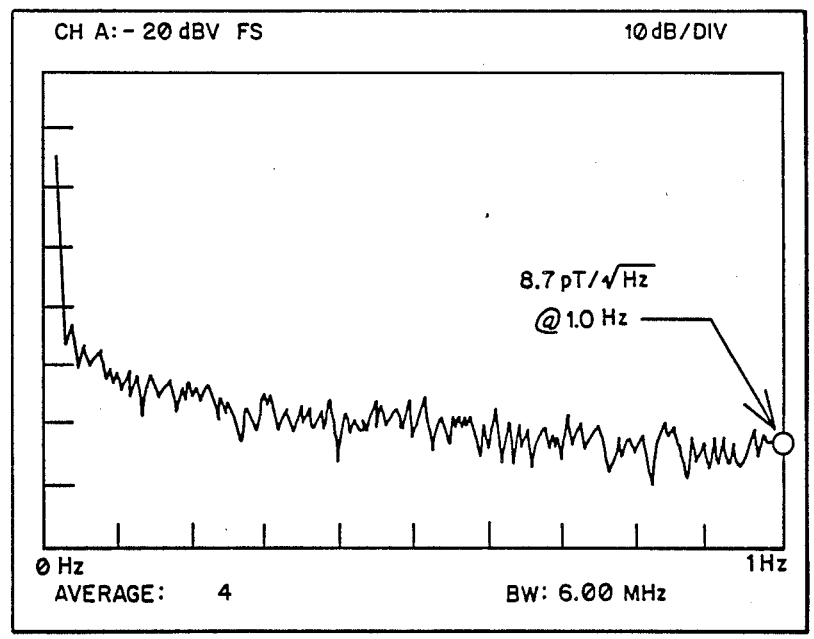
FIG. 15 is a graph of the measured root power spectral density $S^{\frac{1}{2}}$ from 20 mHz to 1.0 Hz of the magnetometer of FIG. 12 wherein the rms voltage at 1.0 Hz corresponds to 8.7 pT/$\sqrt{Hz}$ and the power spectral density exhibits an approximate 1/f rise in its approach to 0 Hz.

Minimum detectable field measurements were performed inside a six-layer cylindrical magnetic shield assembly which exhibits an attenuation factor of $10^{-3}$. The signal voltage power spectral density may be obtained from Eq. (28) and is found to be $$S_{\epsilon'}(\omega) = G^2\eta^2 S_{\overline{B}}(\omega)/(1+\omega^2\tau^2) \quad (29)$$

where $S_{\epsilon'}$ and $S_B$ are the power spectral densities of the magnetometer output and magnetic induction field, respectively. Shown in FIG. 15 is a semilog trace of the magnetometer root power spectral density, expressed in dBV, as a function of frequency from 20 mHz to 1.0 Hz. This measurement was taken at the DC field value of 174 nT corresponding to the lower trace in FIG. 14. The spectral density measured at 1.0 Hz yields an rms fluctuation in the magnetic induction field of $\overline{B}_{rms} = 8.7$ pT/$\sqrt{\text{Hz}}$. The noise floor exhibits an approximate 1/f frequency dependence. A determination of the instrumentation noise was made by removing the piezoelectric element drive voltage and observing a flat field-equivalent noise floor of 4.1 pT/$\sqrt{\text{Hz}}$. The field-equivalent Nyquist noise of the 22Ω pick-up coil was calculated to be 0.5 pT/$\sqrt{\text{Hz}}$. Hence, the minimum detectable field of 8.7 pT/$\sqrt{\text{Hz}}$ at 1.0 Hz corresponds to the ambient field fluctuations in the shield assembly. This conclusion is supported by comparable ambient field measurements made in the identical environment with a state-of-the-art fluxgate magnetometer.

In summary, a magnetostrictive amorphous metal magnetometer has been realized by interfacing a field-annealed ribbon to a resonating piezoelectric plate. The magnetometer exhibits an intrinsic sensitivity of $\eta = 1.25$ nV/pT. It is difficult to estimate the theoretical sensitivity in the absence of a direct measurement for the stress amplitude. However, agreement between theory [Eq. (27)] and experiment may be achieved by assuming a stress amplitude $\sigma_o/\sigma_c = 0.22$ where the critical stress $\sigma_c = 0.9$ MPa. This value for the stress amplitude provides high sensitivity while maintaining device linearity. The measured minimum detectable field capability of 8.7 pT/$\sqrt{\text{Hz}}$ at 1.0 Hz is comparable to that of state-of-the-art fluxgate magnetometers. The sensor element is inexpensive and easily constructed and the electronic signal processing is greatly simplified due to the intrinsic linearity of the magnetostrictive amorphous metal ribbon.

The amorphous metal ribbon magnetometer is unique in providing a highly sensitive sensor which is physically small and capable of detecting small magnetic fields in the presence of the earth's magnetic field. It is useful in any application requiring the detection of ferrous targets or other objects possessing magnetic fields, i.e., geophysical exploration, laboratory instrumentation, and magnetic modeling. It could be used in, e.g., mall and store theft detectors; magnetic silencing and signature measurement instrumentation for ships, submarines and mine sweepers; wide-area land mines (e.g., anti-tank mines); and apparatus for the detection of unexploded ordnances.

In the solid state configuration of FIGS. 7, 8 and 12, the sensor is simple, highly-sensitive, inexpensive, miniature and fieldworthy. These attributes precisely meet the requirements for ship hull mounting for magnetic silencing and signature measurement. A laboratory model, wherein a 2 inch×½ inch×30 μm Metglas 2605S2 ribbon was supported between a PZT5A driver and a rigid support and utilizing the nulling feedback circuit (but without field annealing of the ribbon or the viscous fluid interface), was demonstrated to have a sensitivity of better than 2ηT for a bandwidth of 1 Hz to near DC frequencies and a linear detection range of twenty times the ambient earth s magnetic field (±10⁶ nT.) The size of the laboratory model was about 250 cm³. By the use of solid state techniques, the sensor size should be reduced to about 10 cm³. The sensor has also been demonstrated to be effective with a ribbon ¼ inch×1 inch and the size of the Metglas ribbon can be further reduced.

The scope of applicant's invention is not limited to the specific structures described herein. For example, the viscous fluid interface may be located at one or more of various positions. In the structure of FIG. 5 where ribbon 15 is supported at opposite ends by piezoelectric plate 17 and support 16, the fluid can be positioned either between ribbon 15 and support 16 or it can replace expoxy 18 (at the opposite end of the ribbon between ribbon 15 and piezoelectric plate 17). Alternatively, the fluid can be used on both ends of the ribbon. Furthermore, as shown in FIG. 9, one end of the ribbon can be suspended between a pair of parallel supports with the fluid disposed between each of the supports and the ribbon. The best results have been obtained with the embodiment of FIG. 12, wherein the fluid is disposed between a piezoelectric substrate and a Metglas ribbon or film (as used in this application, the word ribbon includes a film) disposed on one surface of the substrate.

Figure 16:
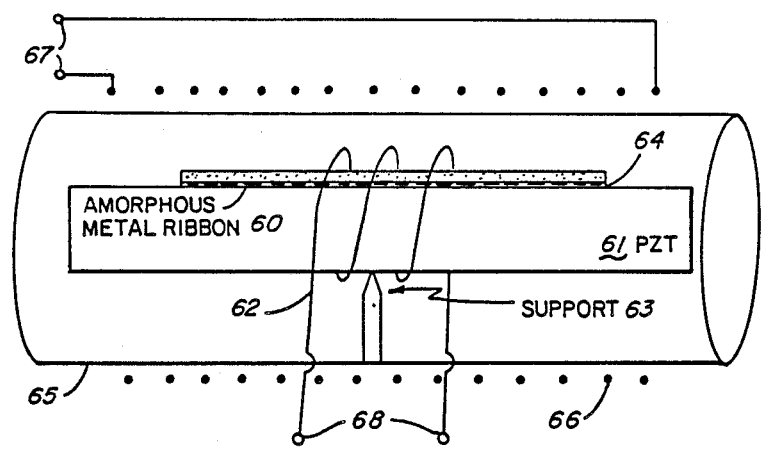
FIG. 16 is a schematic diagram of another embodiment of the stress-relieved mangetometer packaged as a small, solid-state sensor.

A sensor of the type shown in FIG. 12 can be packaged as a small, solid-state device as shown in FIG. 16. A viscous fluid layer 64 is disposed between piezoelectric substrate 61 and amorphous metal ribbon 60. An insulated pick-up coil 62 having output 68 is wrapped around the ribbon (along its longitudinal axis) and substrate without touching the ribbon (so as not to impart stresses to the ribbon). A bar 63 rigidly supports (e.g., with an adhesive) the substrate along its center line and the bar is attached (e.g., with an adhesive) to a rigid nonmagnetic housing 65. An insulating coil 66 having input 67 is wrapped around the housing.

The fluid can be any liquid which provides the necessary viscosity to relieve low-frequency stresses. A fluid is selected such that the longitudinal stress defined by approximately $\alpha/t$, where $\alpha$ is the surface tension coefficient of the fluid/air interface and t is the ribbon thickness, is smaller than the critical stress of the magnetostrictive ribbon. Preferably, the longitudinal stress is one order of magnitude and more preferably from abut one to about four orders o magnitude below the critical stress.

Furthermore, the fluid is selected to exert a shear or frictional stress on the moving ribbon at the dither frequency but not at low frequencies. This is determined by parameters $U_0$, $\eta$ and $\delta$ as set forth in Eq. 22. The frictional force becomes negligible at low frequencies where $U_0$ becomes very small and $\delta$ becomes very large.

Still further, the viscosity of the fluid should be selected based upon the expected rate of temperature change. A preferred viscosity range is from about 0.25 Ms/m² to about 1.0 Ms/m². For a gradual temperature change a more viscous fluid should be used. To the contrary, for faster temperature changes a less viscous fluid should be used.

Suitable fluids include any material having a viscosity similar to that of heavy-grade machine oil, silicone oil, vegetable oil, honey or water. These specific examples are meant to be illustrative and not limiting. Preferably, the fluid is time and temperature stable and does not chemically react with the metallic glass over the temperature range of use, e.g., machine oil, silicone oil, or vegetable oil.

Inasmuch as the invention can be embodied in various forms, it is not intended that the scope of the invention be limited only to the embodiments here described. It is intended rather, that the scope of the invention be construed in accordance with the appended claims, having due regard for obvious changes that do not depart from the essentials of the invention.

What is claimed is:

1. A magnetometer for detecting an applied magnetic field comprising:
   a magnetostrictive element having a longitudinal axis extending between opposing ends of the element;
   means for supporting the element so that the element is free to vibrate longitudinally, said supporting means including a piezoelectric driver;
   means for applying an oscillating electrical driving signal to the driver such that the driver applies an oscillating dither stress to the element which induces magnetization fluctuations along the longitudinal axis of the element of a magnitude proportional to the strength of an applied magnetic field;
   means operated on by the magnetization fluctuations for producing an oscillating electrical measuring signal corresponding thereto;
   means for detecting the measuring signal; and
   a viscous fluid disposed between the magnetostrictive element and the supporting means for reducing the transmission of stresses at a frequency substantially below that of the driving signal which stresses introduce low-frequency noise and change the calibration by changing the piezomagnetic modulus of the element.

2. The magnetometer of claim 1, wherein the viscous fluid reduces transmission of low-frequency stresses caused by thermal expansion or contraction, mechanical vibrations, and mechanical flexing of the magnetostrictive element, piezoelectric driver, and/or other supporting means.

3. The magnetometer of claim 2, wherein the longitudinal stress in the magnetostrictive element is below the critical stress of the magnetostrictive element and the frictional force (due to the fluid viscosity) acting on the magnetostrictive element is substantially negligible at the frequencies of the designated low-frequency stresses.

4. The magnetometer of claim 3, wherein the longitudinal stress on the magnetostrictive element induced by the viscous fluid/air/element interface is at least about one order of magnitude below the critical stress of the magnetostrictive element.

5. The magnetometer of claim 4, wherein the surface tension at the viscous fluid/air interface causes a longitudinal stress on the magnetostrictive element of from about one to about four orders of magnitude below the critical stress of the magnetostrictive element.

6. The magnetometer of claim 5, wherein the viscosity of the fluid and the composition of the fluid are substantially stable over the time and temperature range of use.

7. The magnetometer of claim 4, wherein the viscosity of the fluid is of from about 0.25 Ns/m² to about 1.0 Ns/m².

8. The magnetometer of claim 3, wherein the fluid is selected from the group consisting of heavy grade machine oil, silicone oil, and vegetable oil.

9. The magnetometer of claim 3, wherein the magnetostrictive element is an amorphous metal ribbon.

10. The magnetometer of claim 9, wherein the amorphous metal is a metallic glass.

11. The magnetometer of claim 10, wherein the metallic glass is Metglas.

12. The magnetometer of claim 11, wherein the Metglas is Metglas 2605-S2.

13. The magnetometer of claim 10, wherein the metallic glass is field annealed.

14. The magnetometer of claim 3, further comprising a nulling circuit means for keeping the element within its linear magnetostrictive range and to avoid hysteresis effects by keeping the element at essentially zero magnetic field.

15. The magnetometer of claim 14, wherein the nulling circuit comprises:
- a nulling coil surrounding the element along its longitudinal axis;
- means for applying a current to the nulling coil for producing a nulling magnetic field which opposes and substantially cancels the applied magnetic field so that the field applied to the element is substantially zero; and
- means for measuring the current applied to the nulling coil to thereby determine the amplitude of the applied magnetic field.

16. The magnetometer of claim 15, wherein the magnetometer has a sensing range of at least about $\pm 10^6$ nT.

17. The magnetometer of claim 15, wherein the element is field annealed.

18. The magnetometer of claim 17, wherein the power spectrum measurements demonstrate a minimum detectable magnetic field of about 8.7 pT/$\sqrt{Hz}$ at 1 Hz.

19. A magnetometer for detecting an applied tic field comprising:
- a magnetostrictive element comprising a ribbon of an amorphous metal, said ribbon having a longitudinal axis extending between opposing ends;
- a piezoelectric driver;
- a rigid supporting means;
- means for attaching the ribbon at opposing ends to the driver and supporting means;
- means for applying an oscillating electrical driving signal to the driver such that the driver applies an oscillating dither stress to the ribbon which induces magnetization fluctuations in the ribbon of a magnitude proportional to the strength of the applied magnetic field;
- a pick-up coil surrounding the ribbon along the longitudinal axis thereof wherein tho magnetization fluctuations in the ribbon induce an electroactive force (emf) in the pick-up coil; and
- means for detecting the emf in the pick-up coil for producing an output signal proportional to the applied magnetic field; and
- a viscous fluid disposed between at least one of the interfaces of the supporting means and ribbon and the driver and ribbon for reducing the transmission of stresses at a noise frequency substantially below that of the driving signal which stresses introduce low-frequency noise and change the calibration by changing the piezomagnetic modulus of the ribbon.

20. The magnetometer of claim 19, wherein the supporting means includes a pair of parallel plates and one end of the element is disposed in parallel relation between the plates with the viscous fluid disposed between each of the plate-ribbon interfaces.

21. A magnetometer for detecting an applied magnetic field comprising:
- a piezoelectric substrate;
- a magnetostrictive element comprising a ribbon of an amorphous metal disposed adjacent one surface of the substrate, said ribbon having a longitudinal axis;
- means for applying an oscillating electrical driving signal to the substrate such that the substrate applies an oscillating dither stress to the ribbon which induces magnetization fluctuations in the ribbon of a magnitude proportional to the strength of the applied magnetic field;
- a pick-up coil surrounding the substrate and ribbon along the longitudinal axis thereof wherein the magnetization fluctuations in the ribbon induce an electromotive force (emf) in the pick-up coil;
- means for detecting the emf in the pick-up coil for producing an output signal proportional to the applied magnetic field; and
- a viscous fluid disposed between the substrate and ribbon for reducing the transmission of stresses at a noise frequency substantially below that of the driving signal which stresses introduce low-frequency noise and change the calibration by changing the piezomagnetic modulus of the ribbon.

22. The magnetometer of claim 21 packaged in a housing, further comprising:
- means for supporting the substrate in a substantially stress-free state so that it is free to vibrate;
- a nonmagnetic housing disposed around the ribbon and substrate; and
- means for rigidly connecting the supporting means to the housing.

23. The magnetometer of claim 22, further comprising:
- a nulling coil wrapped around the housing in the direction of the longitudinal axis of the ribbon.

* * * * *

UNITED STATES PATENT AND TRADEMARK OFFICE
CERTIFICATE OF CORRECTION

PATENT NO. : 4,894,615

DATED : January 16, 1990

INVENTOR(S) : Mermelstein

It is certified that error appears in the above-identified patent and that said Letters Patent is hereby corrected as shown below:

Col. 1, after the title, insert -- The U.S. Government has a paid-up license in this invention and the right in limited circumstances to require the patent owner to license others on reasonable terms as provided for by the terms of contract No. N0001484-C-2215 awarded by The Department Of The Navy. --

Col. 2, line 18, after "piezoelectric" insert -- plate --.

Col. 2, line 26, after "piezoelectric" insert -- plate --.

Col. 3, line 66, equation (1), after "=" insert -- - --.

Col. 4, line 6, equation (2), after "=" insert -- - --.

Col. 4, line 41, equation (7), change $$\varepsilon = NAH \frac{d\mu}{d\tau} + NA\mu \frac{dH}{d\tau} \qquad (7)$$

$$\varepsilon = - NAH \frac{d\mu}{dt} - NA\mu \frac{dH}{dt} \qquad (7)$$

UNITED STATES PATENT AND TRADEMARK OFFICE
CERTIFICATE OF CORRECTION

PATENT NO. : 4,894,615

DATED : January 16, 1990

INVENTOR(S) : Mermelstein

It is certified that error appears in the above—identified patent and that said Letters Patent is hereby corrected as shown below:

Col. 4, line 56, equation (9), change $$\varepsilon = NA(H_0 + H_1)\frac{d\mu}{dt} + NA\mu\frac{dH_1}{dt} \qquad (9)$$

to:

$$\varepsilon = -NA(H_0 + H_1)\frac{d\mu}{dt} - NA\mu\frac{dH_1}{dt} \qquad (9)$$

Col. 4, line 59, after equation (9), insert -- where it has been assumed that $dH_0/dt \ll dH_1/dt$. --

Col. 4, line 62, equation (10), after "=" insert -- - --; after $d\mu/dt$, delete "-" and substitute therefore -- + --.

Col. 5, line 1, equation (11), after "=" insert -- -2 --.

Col. 5, line 11, equation (12), after "-" insert -- -2 -- and delete $H_1$.

UNITED STATES PATENT AND TRADEMARK OFFICE
CERTIFICATE OF CORRECTION

PATENT NO. : 4,894,615
DATED : January 16, 1990
INVENTOR(S) : Mermelstein It is certified that error appears in the above—identified patent and that said Letters Patent is hereby corrected as shown below:

Col. 5, line 42, change $$M = \chi H_o^\sigma + \mu_o^{-1} d^H_\sigma \qquad (13)$$

to:

$$M = \chi_o^\sigma H + \mu_o^{-1} d^H_\sigma \qquad (13)$$

Col. 5, line 46, after "stress," insert -- H is the magnetic field strength, $\mu_o$ is the permeability of free space, $\sigma$ is the stress, --.

Col. 5, line 47, after "coefficients" insert -- ($\chi_o^\sigma$ and $d^H$) --.

Col. 6, line 6, after equation 15 insert -- . --.

UNITED STATES PATENT AND TRADEMARK OFFICE
CERTIFICATE OF CORRECTION

PATENT NO. : 4,894,615

DATED : January 16, 1990

INVENTOR(S) : Mermelstein

It is certified that error appears in the above—identified patent and that said Letters Patent is hereby corrected as shown below:

Col. 6, line 11, equation 16, change $$\varepsilon = NA \frac{3\lambda_s}{H_A^2} H_o \frac{d\sigma(t)}{dt} \qquad (16)$$

to:

$$\varepsilon = - NA \frac{3\lambda_s}{H_A^2} H_o \frac{d\sigma(t)}{dt} \qquad (16)$$

Col. 6, line 19, change "saturating" to -- magnetizing --.

Col. 6, line 23, after "the" delete "simple".

Col. 6, line 24, delete "linear".

Col. 6, line 24, after "(16)", insert -- which is linear for low frequency variations of the signal field $H_o$.

Col. 6, line 40, after "a" insert -- linear --.

Col. 6, line 52, equation 18, after "=" insert -- - --; delete "w" and substitute therefore $\omega_o$; after the equation insert --. --.

Col. 6, line 63, delete "fluxgate".

Col. 6, line 66, after equation 20a, add -- which reduces to --.

UNITED STATES PATENT AND TRADEMARK OFFICE
CERTIFICATE OF CORRECTION

PATENT NO. : 4,894,615
DATED : January 16, 1990
INVENTOR(S) : Mermelstein It is certified that error appears in the above—identified patent and that said Letters Patent is hereby corrected as shown below:

Col. 7, line 1, after equation 20(b) insert -- . --.

Col. 7, line 10, change $J/m^3$ to -- $N/m^2$ --.

Col. 7, line 47, after "the" insert -- piezoelectric --.

Col. 7, line 47, delete "for adjusting" and substitute therefore -- so as to adjust --.

Col. 7, line 48, delete "increasing" and substitute therefore -- increase --.

Col. 7, line 60, after "$m^{-1}$" insert -- (the number of coil turns per unit length) --.

Col. 8, line 14, after "this" insert -- AC phase --.

Col. 8, line 14, delete "in" and substitute therefore -- due to --.

Col. 8, line 14, after "the" insert -- change in --.

Col. 9, line 14, after "magnetometer" insert -- by increasing the piezomagnetic modulus $d^H$ --.

Col. 9, line 29, after "only" insert -- external --.

Col. 9, line 30, delete "and".

Col. 9, line 63, change "fluxuation" to -- fluctuation --.

Col. 10, line 2, change "HZ" to -- Hz --.

UNITED STATES PATENT AND TRADEMARK OFFICE
CERTIFICATE OF CORRECTION

PATENT NO. : 4,894,615

DATED : January 16, 1990

INVENTOR(S) : Mermelstein

It is certified that error appears in the above—identified patent and that said Letters Patent is hereby corrected as shown below:

Col. 10, line 49, delete "vectors" and substitute therefore -- numbers --.

Col. 10, line 53, change "$\sqrt{E/\rho}$" to -- $\sqrt{(E/\rho)}$ --.

Col. 10, line 53, after "the" insert -- longitudinal thin-bar --.

Col. 11, line 22, change "$X_8^8$" to -- $x_8^8$ -- .

Col. 11, line 27, equation 25, before "$3\lambda$" insert -- - --.

Col. 11, line 27, change "$H_2^A$" to -- $H_A^2$ --.

Col. 11, line 57, change "$X_8^8$" to -- $x_8^8$ --.

Col. 11, line 65, change "substantially" to -- subsequently --.

Col. 12, lines 55, delete "in the presence of the earth's magnetic field".

Col. 13, line 7, change "$2\eta T$" to -- $2nT$ --.

Col. 13, line 67, two occurances, change "$Ms/M^2$" to -- $Ns/M^2$ --.

UNITED STATES PATENT AND TRADEMARK OFFICE
CERTIFICATE OF CORRECTION

PATENT NO. : 4,894,615
DATED : January 16, 1990
INVENTOR(S) : Mermelstein

It is certified that error appears in the above—identified patent and that said Letters Patent is hereby corrected as shown below:

Col. 3, line 36 - Change "magnetmeter" to -- magnetometer --.

Col. 7, line 54 - After "wire" insert -- . --.

Col. 9, line 35 - Change $3X10^2$ to -- $3X10^{-2}$ --.

Col. 13, line 55 - Change "o" to -- of --.

Col. 16, line 2 - Change "tho" to -- the --.

Signed and Sealed this

Twenty-first Day of May, 1991

Attest:

HARRY F. MANBECK, JR.

Attesting Officer     Commissioner of Patents and Trademarks